United States Patent [19]

Teshima et al.

[11] Patent Number: 4,631,513
[45] Date of Patent: Dec. 23, 1986

[54] DISPLAY UNIT OF SPEEDOMETER FOR AUTOMOBILE

[75] Inventors: Tohru Teshima, Yokohama; Hidehiko Naete, Kawasaki, both of Japan; Pierre H. Robert, Bougival, France

[73] Assignees: Regie Nationale des Usines Renault, Boulogne-Billancourt, France; Stanley Electric Co., Ltd., Tokyo, Japan

[21] Appl. No.: 484,580

[22] Filed: Apr. 13, 1983

[30] Foreign Application Priority Data

Apr. 20, 1982 [JP] Japan .................................. 57-64874

[51] Int. Cl.⁴ .............................................. B60Q 1/00
[52] U.S. Cl. ................................ 340/52 R; 340/52 F; 340/815.01
[58] Field of Search ............. 340/52 R, 52 F, 815.01, 340/753, 754, 715, 709, 721, 722, 670, 62; 324/115; 364/518; 73/2; 116/62.1, 62.2

[56] References Cited

U.S. PATENT DOCUMENTS 3,714,569  1/1973  Bruning, Jr. et al. ............... 324/115
4,291,295  9/1981  Arnold ............................. 340/670 X
4,293,843 10/1981  Bertoloni et al. ................. 340/52 F
4,461,175  7/1984  Baumgart et al. ............... 324/115 X Primary Examiner—John W. Caldwell, Sr.
Assistant Examiner—Tyrone Queen
Attorney, Agent, or Firm—Oblon, Fisher, Spivak, McClelland & Maier

[57] ABSTRACT

A display unit for a speedometer for an automobile, wherein car speed is sensed and displayed in at least two modes including a standard scale mode when car speed is above a set standard speed, and an enlarged scale mode when car speed falls below a lower set speed. The display unit includes a bar graph display, and a scale display, both of which are controlled in correspondence with car speed to operate in either the standard scale mode or the enlarged scale mode.

2 Claims, 3 Drawing Figures

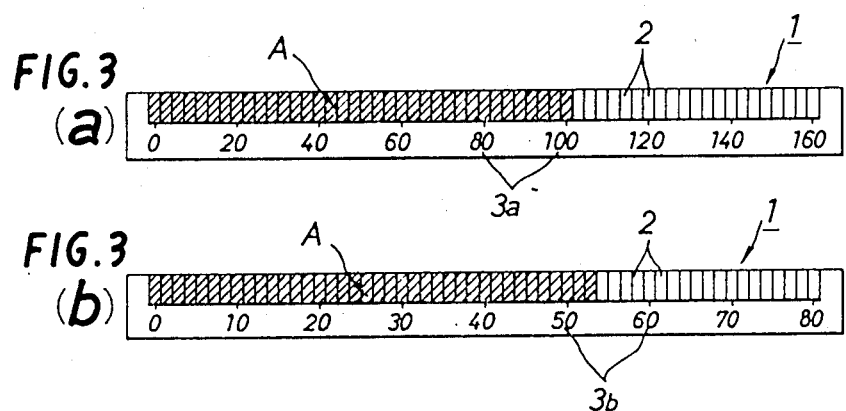

DISPLAY UNIT OF SPEEDOMETER FOR AUTOMOBILE

BACKGROUND OF THE INVENTION

1. Field of the Invention

This invention relates to a display unit of a speedometer for an automobile, in which a liquid-crystal bar graph display is used.

2. Description of the Prior Art

In the conventional speedometer of the above-noted type, it has been variously devised to enable a driver to readily watch the meter. However, in the prior art there has been no disclosure for any display unit capable of gradually increasing the accuracy of scale at speeds below a medium speed, in particular by changing a large space of scale over to a small space of scale or changing a small space of scale over to a large space of scale over the full scale of the meter according to the changes of car speed.

SUMMARY OF THE INVENTION

Accordingly, one object of this invention is to provide a novel display unit of a speedometer for an automobile, wherein means are provided to change the full scale of one and the same display device over to two scale spaces of large space and small space automatically or by means of operating a switch according to a certain set speed.

Namely, this invention provides a display unit of a speedometer for an automobile in which a standard scale display mode displaying speeds ranging from 0 Km/h to a maximum speed on each scale of full scale of the display device and an enlarged scale display mode displaying the speeds ranging from 0 Km/h to a desired set speed as each scale of full scale of the display device are provided. The set speed is made to agree with the maximum scale of the standard scale display mode and the two are changed over to each other automatically or by means of operating a switch according to the changes of car speed. According to the invention, it is easy for a driver to watch the scale display by improving the scale display accuracy concerning medium range speeds, and lower speeds in particular.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(a) and 3(b) are explanative views showing the case where the two kinds of change are made in the display modes of the display device.

As to each segment of the display device, oblique line portions show a functioning state and lineless portions show non-functioning state.

DESCRIPTION OF THE PREFERRED EMBODIMENTS

Figure 1:
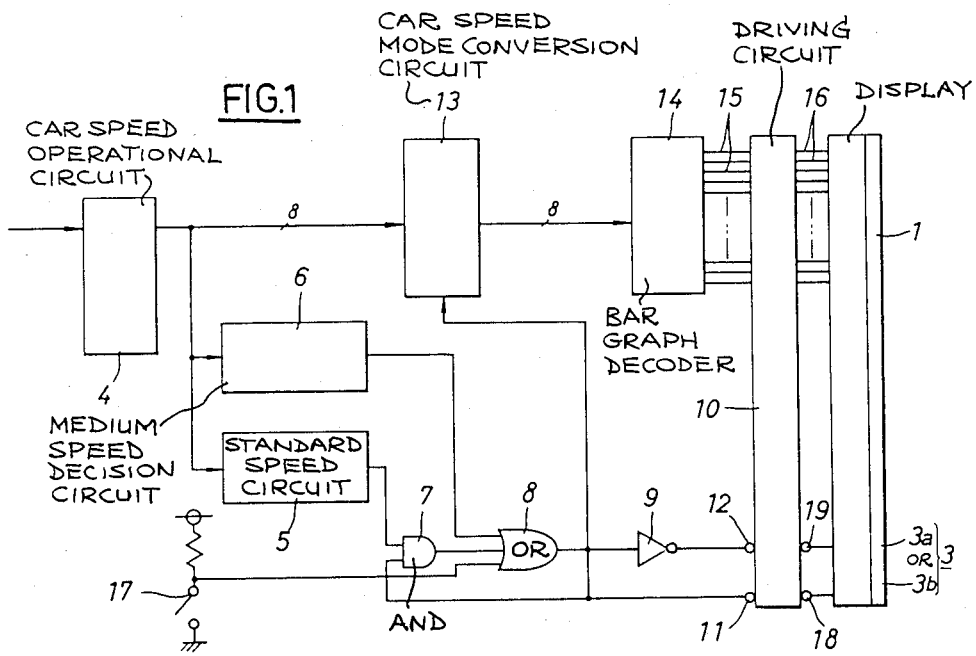
FIG. 1 is a block circuit diagram showing the whole of one embodiment of the display unit of a speedometer for an automobile according to this invention.
Figure 2:
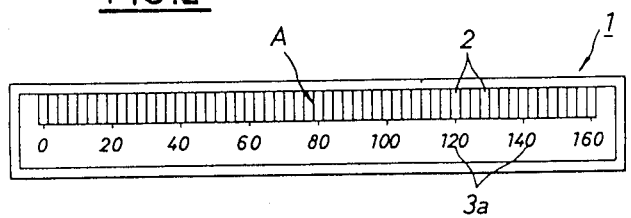
FIG. 2 is a front view of an example of the display device according to this invention.

Referring now to the drawings, wherein like reference numerals designate identical or corresponding parts throughout the several views, and more particularly to FIG. 2 thereof, numeral 1 designates a display device which is formed as a bar graph display A including a necessary number of segments 2 using, for example, liquid crystal display technology. Namely, as shown, n-piece segments 2, each the same in size and formed of long and narrow plates, are arranged and connected together. Each individual segment is displayed in sequence as one scale of a basic unit, changing to two units, for example 5 Km/h, 10 Km/h, and so on. Numeral 3 designates scales of the display device which are displayed as two modes, a standard scale display mode 3a and an enlarged scale display mode 3b.

Accordingly, the display device 1 can display proper numerical values as a result of changes in condition of light and darkness, transparency and turbidity, etc. which are caused by the changes of optical properties of the liquid crystal relative to the necessary segments 2 on which voltage is impressed and are different from the liquid crystal relative to other segments on which no voltage is impressed. Also, the display range may take the necessary construction easy to watch for a driver in the daytime and nightime with transmitted light, reflected light, etc. by display means under DS (dynamic scattering) system, TN (twisted nematic) system, ECB (electrically controlled birefringence) system, PC (phase change) system, etc. according to the difference in the mechanism transforming the changes in condition of liquid crystal caused by electrical signals into optical information.

Further, as to the display device 1, each segment 2 can freely be arranged, for example the arrangement in up-to-down direction, not to speak of the arrangement in right-to-left direction as shown, and can be constructed to desired shapes without being limited to the construction shown, while the display device 1 on the whole can be formed in a circular arc, circle, circular ring, etc. as desired according to the shapes of the segments.

Numeral 4 designates a car speed operational circuit which is so arranged as to make it possible to input car speed pulse signals according to speeds of automobile (car speeds) and to make it possible to transmit desired car speeds as output signals of BCD 8-bit data to the next stage continuously or at intervals of desired set time. Numerals 5 and 6 designate a set standard speed decision circuit and a set medium speed decision circuit which are connected with the car speed decision circuit which are connected with the car speed operational circuit 4 respectively, and, for example 60 Km/h are decided as the set standard speed and 80 Km/h are decided as the set medium speed.

The decision circuit 5 is connected to the AND circuit 2 and the decision circuit 6 arranged so as to transmit output signals to the OR circuit 8 such that when either of these circuits detect any speed exceeding their set speeds. Also, the AND circuit 7 is of a construction capable of inputting a feedback signals from the OR circuit 8 and of transmitting output signals to the OR circuit 8; the circuit 7 is provided with the circuit construction of a kind of self-retaining type. Numeral 9 designates a NOT circuit, and numeral 10 designates a driving circuit for driving the display device. Numeral 11 designates an input part of a standard scale display mode 3a and inputs output signals from the OR circuit 8. Numeral 12 designates an input part of an enlarged scale display mode 3b and inputs output signals from the NOT circuit 9.

Numeral 13 designates a car speed mode conversion circuit which inputs output signals of the car speed operational circuit 4 and is connected with the OR circuit 8. The car speed mode conversion circuit 13 controls output signals from n-piece connecting wires 15 of bar graph decoder 14 connected throught the driving circuit 10 provided with n-piece connecting wires 16 for driving the n-piece segments 2 of the display device 1.

Namely, the car speed mode conversion circuit 13 transmits mode change-over signals depending on output signals from the OR circuit 8, for example;

(i) When the output signals from the OR circuit 8 are "1", the car speed mode conversion circuit 13 changes over to the state of standard scale display mode, and transmits the mode change-over signals capable of functioning n-piece segments 2 in the car speeds ranging from 0 Km/h to the maximum speed of 160 Km/h on full scale.

(ii) When the output signals from the OR circuit 8 are "0", the car speed mode conversion circuit 13 changes over to the state of enlarged scale display mode, and transmits the mode change-over signals capable of functioning n-piece segments 2 in the car speeds ranging from 0 Km/h to the set speed of 80 Km/h on full scale.

Accordingly, in the cases of (i) and (ii) mentioned above, the mode change-over variation is held in the relation of just 2:1 to the same segments 2. Numeral 17 designates a manual switch for forcibly changing the enlarged scale display mode 3b over to the standard scale display mode 3a, and is arranged so as to transmit output signals to the OR circuit 8.

Numerals 18 and 19 designate output port of the driving circuit 10, and are capable of displaying the standard scale display mode 3a and the enlarged scale display mode 3b of the display device 1.

Based on the construction mentioned above, description is made on the operation of this invention.

When car speed signals which change from time to time are inputted in the car speed operational circuit 4 with the running of the automobile, the output signals of 8-bit data are outputted to the next stage according to the changes of car speed.

In case the car speeds do not reach the speeds set respectively, i.e., 60 Km/h and 80 Km/h, on the next stage set standard speed decision circuit 5 and the set medium speed decision circuit 6, no output signals are transmitted from the respective circuits 5 and 6. And further, even though the car speeds reach 60 Km/h or more, the signals are inputted in only one gate of the AND circuit 7, so that no output signals are obtainable from the circuit 7.

Accordingly, in case the car speeds are lower than 80 Km/h, the output signals of the OR circuit 8 become "0", the output signals "1" are obtainable in the NOT circuit 9, signals are inputted in the input port 12, and the signals make the enlarged scale display mode 3b of the display device 1 function from the output part 19 through the driving circuit 10.

As no signals are given from the OR circuit 8 to the car speed mode conversion circuit 13, the circuit 13 changes over to the state of the enlarged scale display mode, mode change-over signals give the output signals, making n-piece segments 2 function in the car speeds ranging from 0 Km/h to the set medium speed of 80 Km/h on full scale on the bar graph decoder 14, to the driving circuit 10 through the connecting wire 15, and the necessary number of segments 2 corresponding to the car speed on the display device 1 are changed to the state shown by the oblique lines of FIG. 3(b) by the driving circuit 10 after changing the optical properties of the liquid crystal in the field on which voltage is impressed, whereby the present speeds of car can be displayed by comparing the optically changed segments 2 with segments 2 in the field on which no voltage is impressed.

Therefore, in case car speeds are lower than 80 Km/h, the accurate and minute measurement of car speeds can be made by enlarging spaces between scales from the standard scale display mode 3a to the enlarged scale display mode 3b.

Next, description is made in the case where car speeds are higher than 80 Km/h.

As output signals are given from the set medium speed decision circuit 6 to the OR circuit 8, the output signals "1" are obtained from the OR circuit 8, the output signals of the NOT circuit 9 become "0", the output signals, which have been transmitted from the NOT circuit 9, are stopped, and the signals to the input part 12 of the driving circuit 10 become "0". On the contrary, however, the output signals "1" are inputted in the input port 11, and output signals function from the output part 18 of the driving circuit 10 to the standard scale display mode 3a, whereby the scales of the display device change over to the standard scale display mode 3a.

As the output signals "1" are inputted from the OR circuit 8 to the car speed mode conversion circuit 13, the circuit 13 changes over to the state of the standard scale display mode 3a, transmits the mode change-over signals capable of functioning n-piece segments 2 on full scale ranging from the car speed of 0 Km/h to the maximum speed of 160 Km/h, and changes the necessary number of segments 2 of the display device 1 corresponding to the car speeds to the state shown by the oblique lines of FIG. 3(a) by changing the optical properties of liquid crystal in the field on which voltage is impressed through the driving circuit 10 from the bar graph decoder 14 as mentioned above, whereby the present speeds of a car can be displayed by comparing the optically changed segments 2 with the segments 2 in the field on which no voltage is impressed.

When the car speeds became lower than 80 Km/h in the state of the standard scale display mode 3a, the output signals from the set medium speed decision circuit 6 disappear in the first place, and therefore, the input signals to the OR circuit 8 become "0"; however, as a kind of self-retaining or hysterisis is formed between the OR circuit 8 and the AND circuit 7 and the output signals of the AND circuit 7 are still added to the OR circuit 8, the output signals of the OR circuit 8 sill maintain "1" and the display device 1 functions in the state of the standard scale display mode 3a.

When the car speeds become lower than 60 Km/h, the output signals from the set standard speed decision circuit 5 disappear, and therefore the output of the AND circuit 7 becomes "0" and the output of the OR circuit 8 also becomes "0" to function the NOT circuit 9, making it possible to change the standard scale display mode 3a over to the enlarged scale display mode 3b.

The above prevents the changing-over of display modes which may be caused frequently by slight changes of increase and decrease in speed on the car speed boundary of 80 Km/h, making it easy for a driver to watch the display by eliminating the flickering therefrom.

Further, by turning on the independent switch 17 installed separately, output signals are added to the OR circuit 8, and therefore output signals "1" are outputted from the OR circuit 8, making it possible to constantly display car speeds by the standard scale display mode 3a.

As mentioned above, this invention makes it possible to carry out two kinds of changing-over of the scale display modes according to the changes of car speed and makes it possible to accurately measure car speeds for easy watching of a driver by enlarging spaces between scales in the enlarged scale display mode using full scale in the case of running an automobile at the standard speed lower than the set medium speed. Therefore, this invention prevents an excess of speed over a regulation speed or an overspeed which may be caused by an error in watching a speedometer on the part of a driver, making it possible for the driver to carry out safe operation of the car.

Also, two kinds of changing-over of display modes of the standard scale display mode and the enlarged scale display mode become a kind of warning display to the reckless driving from the standard speed to the high speed area, and have an effect of securing safe driving.

Obviously, numerous modifications and variations of the present invention are possible in light of the above teachings. It is therefore to be understood that within the scope of the apended claims, the invention may be practiced otherwise than as specifically described herein.

What is claimed as new and desired to be secured by Letters Patent of the United States is:

1. A display unit of a speedometer for an automobile, comprising:
   a car speed operational circuit adapted to receive signals corresponding to car speed for producing and transmitting corresponding output signals;
   a set standard decision circuit coupled to said output signals of said car speed operational circuit for determining when car speed exceeds a set standard speed and for producing a corresponding output;
   a set medium speed decision circuit coupled to said output signals of said car speed operational circuit for determining when car speed exceeds a set medium speed and for producing a corresponding output;
   an OR circuit having plural inputs and an output, including a first input coupled to said output of said set medium speed detector;
   an AND circuit having a first input coupled to an output of said set standard decision circuit, a second input coupled to said output of said OR circuit, and an output coupled to a second input of said OR circuit;
   display means for displaying car speeds in at least two scale modes including a standard scale mode and an enlarged scale mode, including a bar graph display including plural display segments, a scale display, and a driving circuit for selectively driving said segments and said scale display; and
   a car speed mode conversion circuit coupled to said output signals of said car speed operational circuit for converting said output signals thereof to display signals and applying said display signals to said driving circuit, said conversion circuit having a control input coupled to the output of said OR circuit for controlling whether said display signals are operative to produce a standard scale display in said standard mode or an enlarged scale display in said enlarged scale mode based on the output of said OR circuit and which operates in a hysterisis mode;
   said OR circuit output coupled to said driving circuit to control the scale display to display scale as either a standard scale or an enlarged scale.

2. A display unit according to claim 1, comprising:
   a manual override switch coupled to a third input of said OR circuit for forcing the output of said or circuit to control said conversion circuit to produce display signals in said standard display mode.

* * * * *